(12) United States Patent
Warner, II et al.

(10) Patent No.: US 7,289,333 B2
(45) Date of Patent: Oct. 30, 2007

(54) APPARATUS AND METHOD FOR PROVIDING INPUT/OUTPUT VOLTAGE SIGNALS BETWEEN CONNECTED CIRCUIT BOARDS

(75) Inventors: William Arthur Warner, II, Huntsville, AL (US); David Shannon Slaton, Huntsville, AL (US)

(73) Assignee: General Electric Company, Schenectady, NY (US)

( * ) Notice: Subject to any disclaimer, the term of this patent is extended or adjusted under 35 U.S.C. 154(b) by 381 days.

(21) Appl. No.: 10/711,302

(22) Filed: Sep. 9, 2004

(65) Prior Publication Data
US 2006/0050495 A1   Mar. 9, 2006

(51) Int. Cl.
*H01R 12/16* (2006.01)
(52) U.S. Cl. .................. 361/786; 361/789; 361/791
(58) Field of Classification Search ............... None
See application file for complete search history.

(56) References Cited

U.S. PATENT DOCUMENTS

| | | | |
|---|---|---|---|
| 6,159,052 A | 12/2000 | Meng et al. | 439/633 |
| 6,308,234 B1 | 10/2001 | Davies et al. | 710/104 |
| 6,697,883 B1 * | 2/2004 | Jinnouchi | 710/14 |
| 6,983,385 B2 * | 1/2006 | German et al. | 713/300 |

* cited by examiner

*Primary Examiner*—Tuan T. Dinh
(74) *Attorney, Agent, or Firm*—Cantor Colburn LLP

(57) ABSTRACT

A first circuit board connectable to a second circuit board is disclosed. The first circuit board includes at least one set of contacts, a detection circuit, and a voltage generator. Each set of contacts is configured to receive an electrically conductive keypin for bridging a set of the contacts. The detection circuit is in signal communication with the contacts and produces a logic signal in response to a set of the contacts being bridged. The voltage generator is responsive to the logic signal and produces a voltage signal at a connector connectable to the second circuit board. The voltage signal at the connector has a first voltage in response to the keypin being disposed at a first location, and a second different voltage in response to the keypin being disposed at a second location, wherein at least one of the pin locations results in a set of the contacts being bridged.

18 Claims, 4 Drawing Sheets

FIG. 4

| INPUT | | OUTPUT |
|---|---|---|
| 3IN | 5IN | 30N |
| 0 | 0 | 0 |
| 0 | 1 | 1 |
| 1 | 0 | 0 |
| 1 | 1 | 0 |

$30N = 5IN \cdot (3IN)'$

| INPUT | | OUTPUT |
|---|---|---|
| 3IN | 5IN | 50N |
| 0 | 0 | 0 |
| 0 | 1 | 0 |
| 1 | 0 | 1 |
| 1 | 1 | 0 |

$50N = 3IN \cdot (5IN)'$

APPARATUS AND METHOD FOR PROVIDING INPUT/OUTPUT VOLTAGE SIGNALS BETWEEN CONNECTED CIRCUIT BOARDS

BACKGROUND OF THE INVENTION

The present disclosure relates generally to an apparatus and method for providing input/output voltage signals between connected circuit boards, and particularly to an apparatus and method for automatically providing the appropriate input/output voltage signals to the connected circuit board.

PCI (Peripheral Component Interconnect) Mezzanine Cards (PMC) include two classes of input/output (I/O) expansion cards: those that operate with 3.3 volt logic, and those that operate with 5.0 volt logic. The voltage signal used by PMCs is referred to as a VIO (voltage input/output) voltage signal. In order to prevent mismatches between host cards that support one type of logic and expansion cards that support a different type of logic, a mechanical keying pin is employed at the host board. The position of the keying pin on the host board prevents the insertion of an incompatible PMC. Universal PMCs are available that can operate with the host boards using either 3.3 volt logic or 5.0 volt logic. In order to provide a host board that may use either 3.3 volt logic or 5.0 volt logic, so that the host board is compatible with all PMCs (3.3 volt, 5.0 volt, and universal), the VIO signals to the PMC sites are switched to the appropriate voltage level, and the keying pin is positioned accordingly. However, if the voltage switching and keying pin positioning are not matched properly, an incorrect VIO voltage signal may be applied to the PMC expansion card.

Accordingly, there is a need in the art for an apparatus and method for providing properly matched VIO signals between host and expansion boards that overcomes these drawbacks.

BRIEF DESCRIPTION OF THE INVENTION

Embodiments of the invention disclose a first circuit board that is connectable to a second circuit board. The first circuit board includes at least one set of contacts, a detection circuit, and a voltage generator. Each set of contacts is configured to receive an electrically conductive keypin for bridging a set of the contacts. The detection circuit is in signal communication with the at least one set of contacts and produces a logic signal in response to a set of the contacts being bridged. The voltage generator is responsive to the logic signal and produces a voltage signal at a connector connectable to the second circuit board. The voltage signal at the connector has a first voltage value in response to the keypin being disposed at a first pin location, and a second different voltage value in response to the keypin being disposed at a second pin location, wherein at least one of the pin locations results in a set of the contacts being bridged.

Other embodiments of the invention disclose a method of providing a voltage signal from a first circuit board directed to a second circuit board in response to the attachment of a keypin to the first circuit board. A first input signal is generated in response to the keypin being attached to the first circuit board at a first location, and a second different input signal is generated in response to the keypin being attached to the first circuit board at a second different location. In response to the first input signal, a first logic signal is generated, and in response to the second input signal, a second different logic signal is generated. In response to the first logic signal, a first voltage signal is generated at a common output point, and in response to the second logic signal, a second different voltage signal is generated at the common output point.

BRIEF DESCRIPTION OF THE DRAWINGS

Referring to the exemplary drawings wherein like elements are numbered alike in the accompanying Figures:

FIG. 4 depicts exemplary logic tables associated with the logic circuits of FIG. 3.

DETAILED DESCRIPTION OF THE INVENTION

Embodiments of the invention provide a host circuit board with an electronic circuit and a mechanical device that provides automatic switching of input/output voltages (VIO) used by an expansion circuit board. While embodiments described herein may depict a PCI Mezzanine Card (PMC) as an exemplary expansion circuit board, it will be appreciated that the disclosed invention may be applicable to other circuit board arrangements where one circuit board is electrically and mechanically connected to another circuit board.

Figure 1:
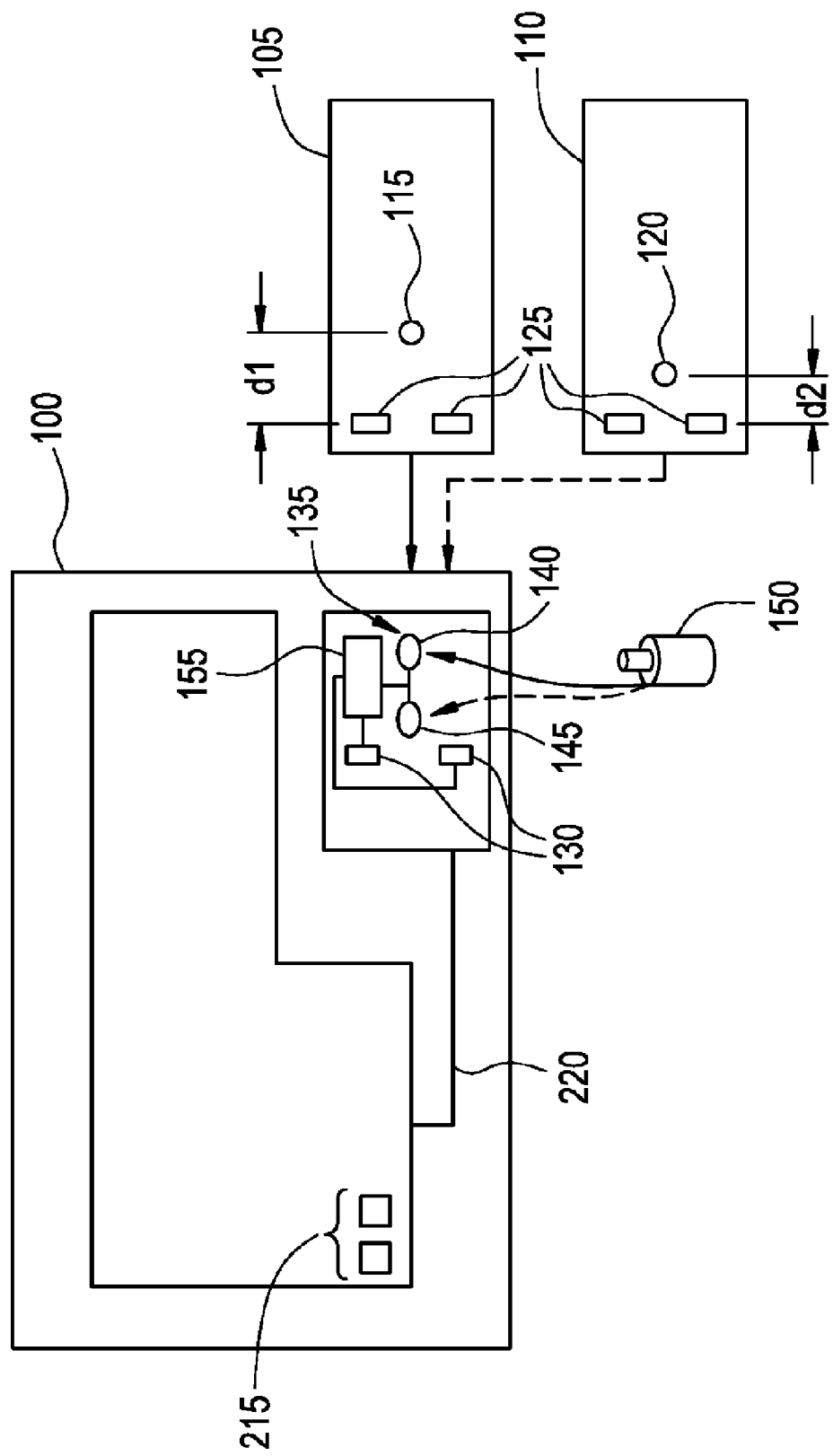
FIG. 1 depicts an exemplary first circuit board connectable to an exemplary second circuit board in accordance with embodiments of the invention.

FIG. 1 is an exemplary embodiment of a first circuit board 100 connectable to a second circuit board 105, 110, where second circuit board 105 may be a 3.3 volt board and second circuit board 110 may be a 5.0 volt board, and where either second board 105 or second board 110 is connected to first board 100 at any one time in a manner to be described below. In an exemplary embodiment, first board 100 is a host circuit board, and second board 105, 110 is an expansion circuit board such as a PMC for example. Second board 105 has an opening 115 at a first location d1, and second board 110 has an opening 120 at a second different location d2. Each second board 105, 110 has a set of connectors 125 for connecting with the set of connectors 130 on first circuit board 100. In an embodiment, connectors 130 on first board 100 are also referred to as VIO targets, which represent input/output voltage points that are responsive to a voltage signal to and from connectors 125 of second board 105, 110.

In an embodiment, first circuit board 100 includes a plurality of sets of contacts 135 having a first set 140 in a first location and a second set 145 in a second different location, where each set is configured to receive an electrically conductive keypin 150 for bridging the set of contacts 140, 145 that it is mechanically attached to. While the first and second sets of contacts 140, 145 are depicted having two opposing semi-circular shapes, it will be appreciated that any number of contacts and any shape may be employed that would be suitable for the purposes disclosed herein. As depicted in FIG. 1, a keypin 150 that attaches to first circuit board 100 to bridge the first set of contacts 140 is illustrated by a solid arrowhead-line, and a keypin 150 that attaches to bridge the second set of contacts 145 is illustrated by a dashed arrowhead-line.

Figure 2:
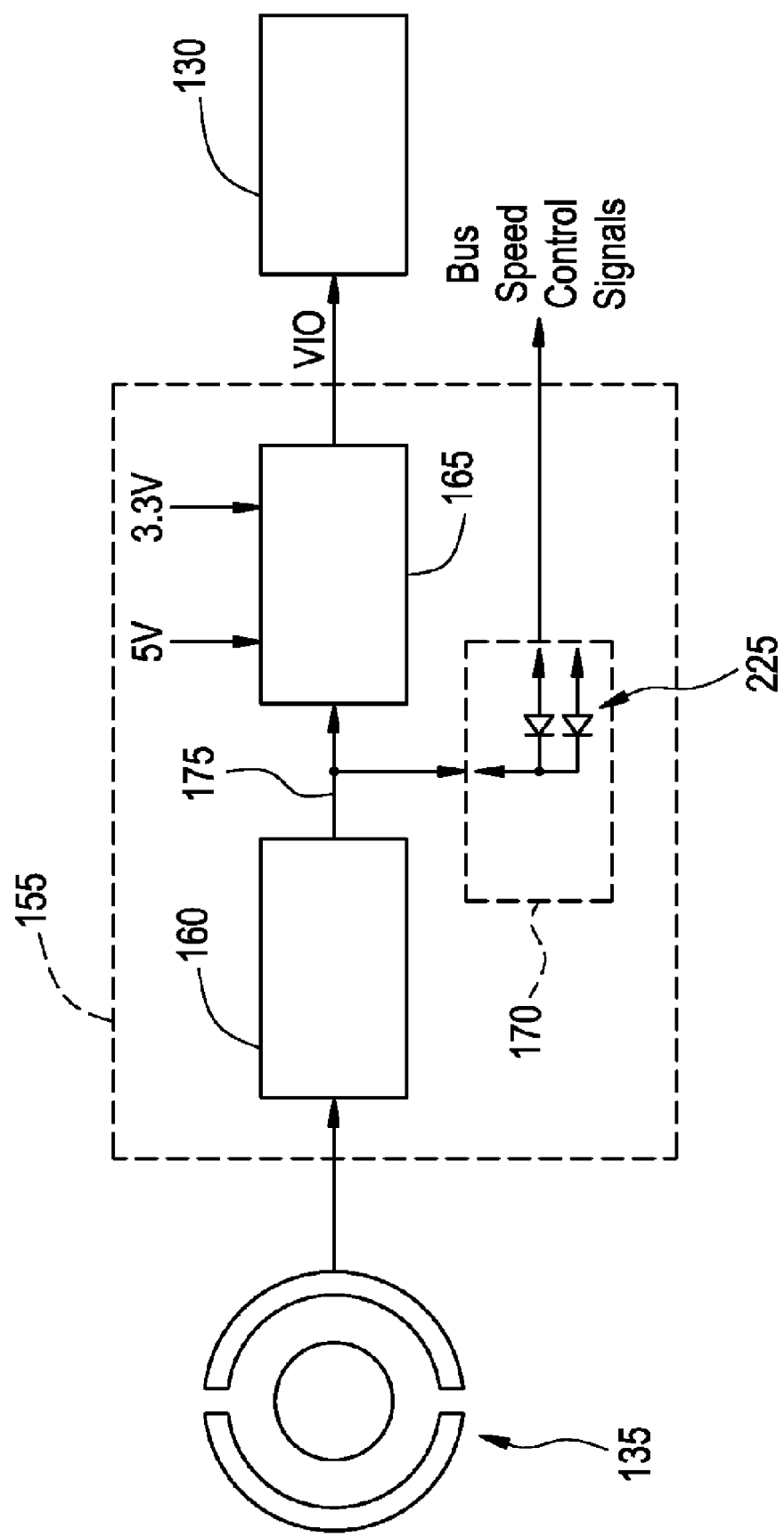
FIG. 2 depicts an exemplary circuit block diagram for implementing embodiments of the invention.

A driver circuit 155 is disposed in signal communication between the sets of contacts 135 and the connectors (VIO targets) 130, which is best seen by now referring to FIG. 2. In an embodiment, driver circuit 155 includes a detection circuit 160, a voltage generator 165, and an optional auxiliary control circuit 170 (discussed in further detail below).

Figure 3:
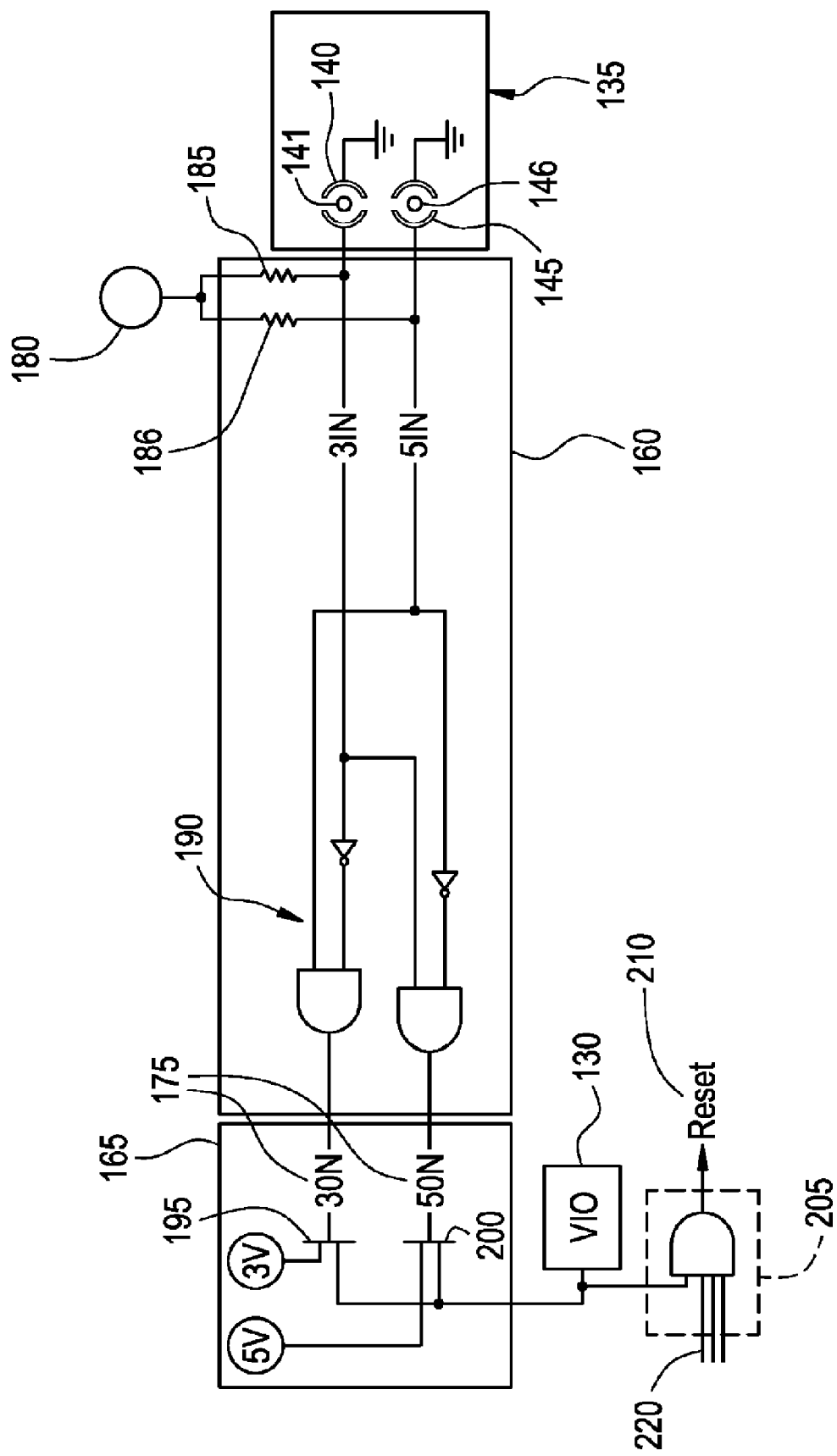
FIG. 3 depicts exemplary logic circuits associated with the block diagram of FIG. 2.

Detection circuit 160 is in signal communication with the plurality of sets of contacts 135 (depicted in FIG. 2 as a single set of semi-circular contacts, but understood to represent one or more sets of contacts), and is productive of a logic signal 175 in response to a set of the contacts 135 being bridged. The logic signal 175 is received at the voltage generator 165, which responds thereto to produce a voltage signal VIO at connector 130. The voltage signal VIO has a first value in response to the keypin 150 bridging the first set of contacts 140, and a second different value in response to the keypin 150 bridging the second set of contacts 145. In an embodiment, the first value is about 3.3 volts, and the second value is about 5.0 volts. Referring now to FIG. 3, which depicts exemplary logic circuits associated with the block diagram of FIG. 2, a first input signal "3IN" results at the input of detection circuit 160 in response to the keypin 150 being placed to bridge the first set of contacts 140, and a second input signal "5IN" results at the input of detection circuit 160 in response to the keypin 150 being placed to bridge the second set of contacts 145. Voltage source 180 and resistors 185, 186, in combination with the presence of keypin 150 at a particular location, provide the appropriate voltage to differentiate input signals 3IN and 5IN. In response to input signals 3IN and 5IN, the logic circuitry 190 of detection circuit 160 provides an output logic signal 175 of "3ON" if 3IN is present at the input side, and an output logic signal 175 of "5ON" if 5IN is present at the input side. FIG. 4 depicts the negative logic tables (negative logic notation) that result from exemplary logic circuitry 190. For example, and with reference to FIG. 4, a "0" at the input of logic circuitry 190 represents the presence of a keypin 150 bridging the associated set of contacts 140, 145, and a "1" on the output represents the presence of a logic signal 175. As can be seen from FIG. 4, a logic signal 175 of 3ON is present if a keypin 150 is bridging only the first set of contacts 140 (but not both), and a logic signal 175 of 5ON is present if a keypin 150 is bridging only the second set of contacts 145 (but not both). The logic associated with the logic tables of FIG. 4 can be summarized by the logic equations shown, which are read as: "3ON is a logical '1' in response to 5IN AND NOT 3IN", and "5ON is a logical '1' in response to 3IN AND NOT 5IN".

In response to logic signal 175 being 3ON, a first control voltage having a first value is provided at connector 130, and in response to logic signal 175 being 5ON, a second control voltage having a second different value is provided at connector 130. In an embodiment, the first value is 3.3 volts and the second value is 5.0 volts. The voltage signal VIO at connector 130 is determined by which electronic switch 195, 200 is turned on. In the presence of logic signal 175 being 3ON, switch 195 is turned on and the 3.3 volt supply "3V" provides voltage to connector 130. In the presence of logic signal 175 being 5ON, switch 200 is turned on and the 5 volt supply "5V" provides voltage to connector 130.

Thus, in response to keypin 150 bridging only the first set of contacts 140, a 3.3 volt signal is present at connector 130, and in response to keypin 150 bridging only the second set of contacts 145, a 5.0 volt signal is present at connector 130. In an embodiment, connector 130 is a single conductor that may have impressed upon it a voltage of about 3.3 volts or a voltage of about 5.0 volts, depending on the output of logic circuitry 190 and the state of switches 195, 200.

In an alternative embodiment, a reset circuit 205 is disposed in signal communication with voltage generator 165 and is responsive to the voltage signal VIO, such that a reset signal "Reset" is produced in the absence of the voltage signal VIO being at either the first value, about 3.3 volts for example, or the second value, about 5.0 volts for example. In another alternative embodiment, the first circuit board 100 may include other reset signal generators 215, such as a master reset signal generator and an onboard reset signal generator for example, that are in signal communication with reset circuit 205 via signal lines 220 for producing a reset signal in response to any of the signal lines 220 having a voltage signal below a threshold value.

In a further alternative embodiment, a control circuit 170 may be disposed in signal communication with detection circuit 160 for controlling the speed of communication between the first 100 and second 105, 110 circuit boards in response to the voltage signal VIO being at about 5.0 volts, or more generally, in response to keypin 150 being disposed at pin location 146. In an exemplary control circuit 170, diodes 225 may be employed to disallow high speed communication at speeds greater than about 33 Mega-Hertz, for example.

Referring back to FIG. 1, keypin 150 may be mechanically attached to first circuit board 100 by sitting it on top of a semi-circular set of contacts 135 (either the first set 140 or the second set 145) and securing it via a screw (not shown) from the underside of the first board 100. While a screw is disclosed as an exemplary securing means, it will be appreciated that any means suitable for securing keypin 150 to first board 100 may be used, such as a snap fit arrangement or a twist lock arrangement, for example, as long as the keypin 150 is mechanically secure and provides and electrical bridge across a set of contacts 135.

As can be seen by reference to FIG. 1, second circuit board 105 having opening 115 at first location d1 may be attached to first circuit board 100 with connectors 125 and 130 lining up with each other if keypin 150 is attached at the first set of contacts 140 (producing a VIO voltage signal of about 3.3 volts), but not if keypin 150 is attached at the second set of contacts 145 (producing a VIO voltage signal of about 5.0 volts). And, second circuit board 110 having opening 120 at second location d2 may be attached to first circuit board 100 with connectors 125 and 130 lining up with each other if keypin 150 is attached at the second set of contacts 145 (about 5.0 volts), but not if keypin 150 is attached at the first set of contacts 140 (about 3.3 volts). In this manner, first circuit board 100, having the keypin 150 mechanically attached to bridge the first set of contacts 140, mechanically rejects a second circuit board 110 operable at a voltage of about 5.0 volts where the first circuit board 100 is configured to deliver a VIO voltage signal of about 3.3 volts. Similarly, the first circuit board 100, having the keypin 150 mechanically attached to bridge the second set of contacts 145, mechanically rejects a second circuit board 105 operable at a voltage of about 3.3 volts where the first circuit board 100 is configured to deliver a VIO voltage signal of about 5.0 volts.

In view of the foregoing, a method of providing a voltage signal VIO from a first circuit board 100 directed to a second circuit board 105, 110, in response to the attachment of a keypin 150 to the first circuit board 100 at a first 140 or a second 145 location, may be accomplished.

In an embodiment of the method, a first input signal 3IN is generated in response to the keypin 150 being attached to the first circuit board 100 at a first location 140, and a second different input signal 5IN is generated in response to the keypin 150 being attached to the first circuit board 100 at a second different location 145. A first logic signal 3ON is generated in response to the first input signal 3IN, and a second different logic signal 5ON is generated in response to the second input signal 5IN. At a common point 130, a first voltage signal VIO of about 3.3 volts is generated in response to the first logic signal 3ON, and a second different voltage signal VIO of about 5.0 volts is generated in response to the second logic signal 5ON. In the absence of a keypin 150 in either of the first 140 or second 145 locations, a reset signal "Reset" may be generated. In response to the second voltage signal VIO being at about 5.0 volts, the speed of communication between the first 100 and the second 105, 110 circuit boards may be controlled via control circuit 170.

In an alternative embodiment to that discussed above, first circuit board 100 may include only a single set of contacts 145, where the first set of contacts 140 may be shorted out to provide a default 3.3 volt signal at connector 130 in the absence of a keypin 150 at pin location 146. If a keypin 150 is present at pin location 141, or is not present at all, then the default voltage signal VIO will be 3.3 volts. If a keypin 150 is present at pin location 146, then the voltage signal VIO changes to 5.0 volts. In accordance with embodiments utilizing only a single set of contacts 145, it will be appreciated that the logic circuitry 190 and the logic tables of FIG. 4 may be modified as appropriate for the purposes disclosed herein.

While embodiments of the invention have been disclosed herein having a first 140 and a second 145 set of contacts, or only a single set of contacts 145, operating at two different voltage levels, such as 3.3 volts and 5.0 volts, for example, it will be appreciated that the scope of the invention is not so limited and is also applicable to more than two sets of contacts and to multiple voltage levels. For example, a third set of contacts, not shown, may be included of first circuit board 100 to provide another voltage level distinction, such as 7.0 volts for example, for another type of expansion board 105, 110, with the logic circuitry 190 and the logic tables of FIG. 4 being modified accordingly.

As disclosed, some embodiments of the invention may include some of the following advantages: the ability to automatically provide the appropriate input/output voltage signal to a PMC from a host board while also providing a mechanical rejection feature to prevent the inadvertent connection of the incorrect PMC to the host board; a single user action involving the attachment of a PMC keying pin to the host board that configures the host board for either 3.3 volts or 5.0 volts input/output; the ability to automatically switch between multiple voltages, not just between two, for use with a variety of expansion boards having different operating voltages; and, prevention of host board operation in the event that a keying pin is incorrectly installed.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to a particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A first circuit board connectable to a second circuit board, the first circuit board comprising:
   at least one set of contacts, each set configured to receive an electrically conductive keypin for bridging a set of the contacts;
   a detection circuit in signal communication with the at least one set of contacts, the detection circuit productive of a logic signal in response to a set of the contacts being bridged; and
   a voltage generator responsive to the logic signal and productive of a voltage signal at a connector connectable to the second circuit board;
   wherein the voltage signal at the connector has a first voltage value in response to the keypin being disposed at a first pin location, and a second different voltage value in response to the keypin being disposed at a second pin location, wherein at least one of the pin locations results in a set of the contacts being bridged;
   wherein the voltage signal has the first voltage value in response to one keypin being disposed at the first pin location, and does not have the first voltage value in response to the one keypin being disposed at the first pin location and another keypin being disposed at the second pin location; and
   wherein the voltage signal has the second voltage value in response to one keypin being disposed at the second pin location, and does not have the second voltage value in response to the one keypin being disposed at the second pin location and another keypin being disposed at the first pin location.

2. The first circuit board of claim 1, wherein:
   in response to the keypin being disposed at the first pin location, a first input signal is provided to the detection circuit; and
   in response to the keypin being disposed at the second pin location, a second different input signal is provided to the detection circuit.

3. The first circuit board of claim 1, wherein the voltage generator comprises a switch.

4. The first circuit board of claim 1, wherein:
   the first voltage signal has a voltage level of about 3.3 volts; and
   the second voltage signal has a voltage level of about 5.0 volts.

5. The first circuit board of claim 1, further comprising:
   a reset circuit responsive to the voltage signal such that a reset signal is produced in the absence of the voltage signal having at least one of the first and the second voltage values.

6. The first circuit board of claim 1, wherein:
   the first circuit board, having the keypin mechanically attached at the first pin location, mechanically rejects the second circuit board if the second circuit board is operable at a voltage signal having the second voltage value; and
   the first circuit board, having the keypin mechanically attached at the second pin location, mechanically rejects the second circuit board if the second circuit board is operable at a voltage signal having the first voltage value.

7. The first circuit board of claim 1, wherein:
the connector comprises a single conductor receptive of the voltage signal at the first and the second voltage values.

8. The first circuit board of claim 4, further comprising:
a control circuit responsive to the detection circuit for controlling the speed of communication between the first and the second circuit board in response to the keypin being disposed at the second pin location.

9. The first circuit board of claim 5, further comprising:
a plurality of reset signal generators;
wherein the reset circuit is further responsive to a plurality of signals from the plurality of reset signal generators.

10. The first circuit board of claim 9, wherein the plurality of reset signal generators comprises a master reset signal generator, an onboard reset signal generator, or any combination comprising at least one of the foregoing.

11. A method of providing a voltage signal from a first circuit board directed to a second circuit board in response to the attachment of a keypin to the first circuit board, the method comprising:
generating a first input signal in response to the keypin being attached to the first circuit board at a first location, and generating a second different input signal in response to the keypin being attached to the first circuit board at a second different location;
generating a first logic signal in response to the first input signal, and generating a second different logic signal in response to the second input signal; and
generating at a common output point a first voltage signal in response to the first logic signal and a second different voltage signal in response to the second logic signal;
wherein the first voltage signal has a first voltage value in response to one keypin being attached at the first location, and does not have the first voltage value in response to the one keypin being attached at the first pin location and another keypin being attached at the second pin location; and
wherein the second voltage signal has a second voltage value in response to one keypin being attached at the second location, and does not have the second voltage value in response to the one keypin being attached at the second location and another keypin being attached at the first pin location.

12. The method of claim 11, further comprising:
receiving a keypin at the first circuit board at a first location, a second location, or any combination comprising at least one of the foregoing locations.

13. The method of claim 11, further comprising:
generating a reset signal in response to the absence of the keypin in at least one of the first location and the second location.

14. The method of claim 11, wherein:
the first voltage signal has a voltage value of about 3.3 volts; and
the second voltage signal has a voltage value of about 5.0 volts.

15. The method of claim 11, further comprising:
controlling the speed of communication between the first circuit board and the second circuit board in response to the keypin being disposed at the second pin location.

16. The method of claim 11, further comprising:
providing a mechanical rejection to prevent the attachment of the second circuit board to the first circuit board if the keypin is mechanically attached at the first location and the second circuit board is operable at the voltage of the second voltage signal; and
providing a mechanical rejection to prevent the attachment of the second circuit board to the first circuit board if the keypin is mechanically attached at the second location and the second circuit board is operable at the voltage of the first voltage signal.

17. A first circuit board connectable to a second circuit board, the first circuit board comprising:
at least one set of contacts, each set configured to receive an electrically conductive keypin for bridging a set of the contacts;
a detection circuit in signal communication with the at least one set of contacts, the detection circuit productive of a logic signal in response to a set of the contacts being bridged; and
a voltage generator responsive to the logic signal and productive of a voltage signal at a connector connectable to the second circuit board;
wherein the voltage signal at the connector has a first voltage value in response to the keypin being disposed at a first pin location, and a second different voltage value in response to the keypin being disposed at a second pin location, wherein at least one of the pin locations results in a set of the contacts being bridged;
wherein the first circuit board, having the keypin mechanically attached at the first pin location, mechanically rejects the second circuit board if the second circuit board is operable at a voltage signal having the second voltage value; and
wherein the first circuit board, having the keypin mechanically attached at the second pin location, mechanically rejects the second circuit board if the second circuit board is operable at a voltage signal having the first voltage value.

18. A method of providing a voltage signal from a first circuit board directed to a second circuit board in response to the attachment of a Keypin to the first circuit board, the method comprising:
generating a first input signal in response to the keypin being attached to the first circuit board at a first location, and generating a second different input signal in response to the keypin being attached to the first circuit board at a second different location;
generating a first logic signal in response to the first input signal, and generating a second different logic signal in response to the second input signal;
generating at a common output point a first voltage signal in response to the first logic signal and a second different voltage signal in response to the second logic signal;
providing a mechanical rejection to prevent the attachment of the second circuit board to the first circuit board if the keypin is mechanically attached at the first location and the second circuit board is operable at the voltage of the second voltage signal; and
providing a mechanical rejection to prevent the attachment of the second circuit board to the first circuit board if the keypin is mechanically attached at the second location and the second circuit board is operable at the voltage of the first voltage signal.

* * * * *